(12) United States Patent
Lin

(10) Patent No.: US 10,741,561 B2
(45) Date of Patent: Aug. 11, 2020

(54) DYNAMIC RANDOM ACCESS MEMORY STRUCTURE INCLUDING GUARD RING STRUCTURE

(71) Applicant: Winbond Electronics Corp., Taichung (TW)

(72) Inventor: Chih-Hao Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/565,519

(22) Filed: Sep. 10, 2019

(65) Prior Publication Data
US 2020/0006347 A1 Jan. 2, 2020

Related U.S. Application Data

(62) Division of application No. 15/588,713, filed on May 8, 2017, now Pat. No. 10,453,848.

(30) Foreign Application Priority Data

Nov. 1, 2016 (CN) .......................... 2016 1 0967723

(51) Int. Cl.
| | | |
|---|---|---|
| *H01L 27/10* | (2006.01) | |
| *H01L 29/66* | (2006.01) | |
| *H01L 27/108* | (2006.01) | |
| *H01L 21/768* | (2006.01) | |
| *H01L 23/58* | (2006.01) | |
| *H01L 27/092* | (2006.01) | |

(Continued)

(52) U.S. Cl.
CPC .. *H01L 27/10814* (2013.01); *H01L 21/76802* (2013.01); *H01L 23/585* (2013.01); *H01L 27/092* (2013.01); *H01L 27/10855* (2013.01); *H01L 27/10873* (2013.01); *H01L 27/10891* (2013.01); *H01L 27/10894* (2013.01); *H01L 27/10897* (2013.01); *H01L 29/66545* (2013.01); *H01L 21/823842* (2013.01); *H01L 29/513* (2013.01); *H01L 29/517* (2013.01); *H01L 29/6659* (2013.01)

(58) Field of Classification Search
CPC ......... H01L 27/10814; H01L 21/76802; H01L 23/585; H01L 27/092; H01L 27/10855; H01L 27/10873; H01L 27/10891; H01L 27/10894; H01L 27/10897; H01L 29/66545; H01L 21/823842; H01L 29/513; H01L 29/517; H01L 29/6659
USPC ................... 257/296; 438/238, 239, 386, 399
See application file for complete search history.

(56) References Cited

U.S. PATENT DOCUMENTS

| | | | |
|---|---|---|---|
| 6,346,736 B1* | 2/2002 | Ukeda ............... | H01L 21/76232 257/509 |
| 2003/0011032 A1* | 1/2003 | Umebayashi ..... | H01L 27/10876 257/368 |

(Continued)

*Primary Examiner* — Didarul A Mazumder
(74) *Attorney, Agent, or Firm* — JCIPRNET

(57) ABSTRACT

A dynamic random access memory (DRAM) structure is provided, and the DRAM structure includes a substrate, a DRAM, and a guard ring structure. The substrate includes a memory cell region. The DRAM is disposed in the memory cell region. The DRAM includes a capacitor contact coupled to a capacitor structure. The guard ring structure surrounds a border of the memory cell region. The capacitor contact and the guard ring structure originate from the same conductive layer.

9 Claims, 10 Drawing Sheets

(51) Int. Cl.
*H01L 21/8238* (2006.01)
*H01L 29/51* (2006.01)

(56) References Cited

U.S. PATENT DOCUMENTS

| | | | | |
|---|---|---|---|---|
| 2007/0013011 | A1* | 1/2007 | Yoshizawa | H01L 23/485 257/409 |
| 2011/0165756 | A1* | 7/2011 | Isogai | H01L 23/585 438/397 |
| 2011/0266603 | A1* | 11/2011 | Nakamura | H01L 27/10817 257/306 |
| 2013/0052786 | A1* | 2/2013 | Lee | H01L 27/10855 438/381 |

* cited by examiner

DYNAMIC RANDOM ACCESS MEMORY STRUCTURE INCLUDING GUARD RING STRUCTURE

CROSS-REFERENCE TO RELATED APPLICATION

This application is a divisional application of and claims the priority benefit of U.S. application Ser. No. 15/588,713, filed on May 8, 2017, which claims the priority benefit of China application serial no. 201610967723.8, filed on Nov. 1, 2016. The entirety of each of the above-mentioned patent applications is hereby incorporated by reference herein and made a part of this specification.

FIELD OF THE INVENTION

The invention relates to a memory structure and a manufacturing method thereof, and more particularly, relates to a dynamic random access memory (DRAM) structure and a manufacturing method thereof.

DESCRIPTION OF RELATED ART

In a peripheral circuit region of a conventional dynamic random access memory (DRAM) structure, a doped polysilicon is adopted as a gate material for a transistor device, constantly leading to a poly depletion effect and lowering the performance of the device as a result.

A type of transistor device using a metal gate structure, instead of the doped polysilicon gate, is thus developed, and the transistor device can effectively prevent the poly depletion effect from being generated.

However, how to effectively integrate a DRAM manufacturing process and a process of manufacturing a transistor device with the metal gate structure is an issue that the industry needs to solve urgently. Moreover, how to effectively lower complexity of the DRAM manufacturing process is also an ongoing effort of the industry nowadays.

SUMMARY OF THE INVENTION

The invention provides a manufacturing method of a dynamic random access memory (DRAM) structure which can effectively integrate a DRAM manufacturing process and a process of manufacturing a transistor structure with a metal gate structure.

The invention provides a DRAM structure which can prevent components in the memory cell region from being damaged during a process of forming the transistor structure in a peripheral circuit region.

In an embodiment of the invention, a method of manufacturing a DRAM structure is provided, and the method includes following steps. A substrate is provided, wherein the substrate includes a memory cell region and a peripheral circuit region. A DRAM is formed in the memory cell region. The DRAM includes a capacitor contact coupled to a capacitor structure. A transistor structure with a metal gate structure is formed in the peripheral circuit region. The metal gate structure is formed by a manufacturing process using a dummy gate. The capacitor contact and the dummy gate are formed by the same conductive layer.

In an embodiment of the invention, a dynamic random access memory (DRAM) structure is provided, and the DRAM structure includes a substrate, a DRAM, and a guard ring structure. The substrate includes a memory cell region. The DRAM is disposed in the memory cell region. The DRAM includes a capacitor contact coupled to a capacitor structure. The guard ring structure surrounds a border of the memory cell region. The capacitor contact and the guard ring structure originate from the same conductive layer.

In view of the foregoing, as for the manufacturing method of the DRAM structure provided by an embodiment of the invention, since the capacitor contact and the dummy gate are formed by the same conductive layer, the DRAM manufacturing process and the process of manufacturing the transistor structure with the metal gate structure can be integrated effectively, and complexity of the manufacturing process can be reduced effectively.

In addition, since the DRAM structure provided by an embodiment of the invention has the guard ring structure surrounding the border of the memory cell region, the DRAM structure effectively can prevent the components in the memory cell region from being damaged during the process of forming the transistor structure in the peripheral circuit region. Moreover, since the capacitor contact and the guard ring structure originate from the same conductive layer, complexity of the manufacturing process can be reduced effectively.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIGS. 1A to 1H are cross-sectional diagrams illustrating a manufacturing process of a dynamic random access memory (DRAM) structure according to an embodiment of the invention.

Figure 1A:
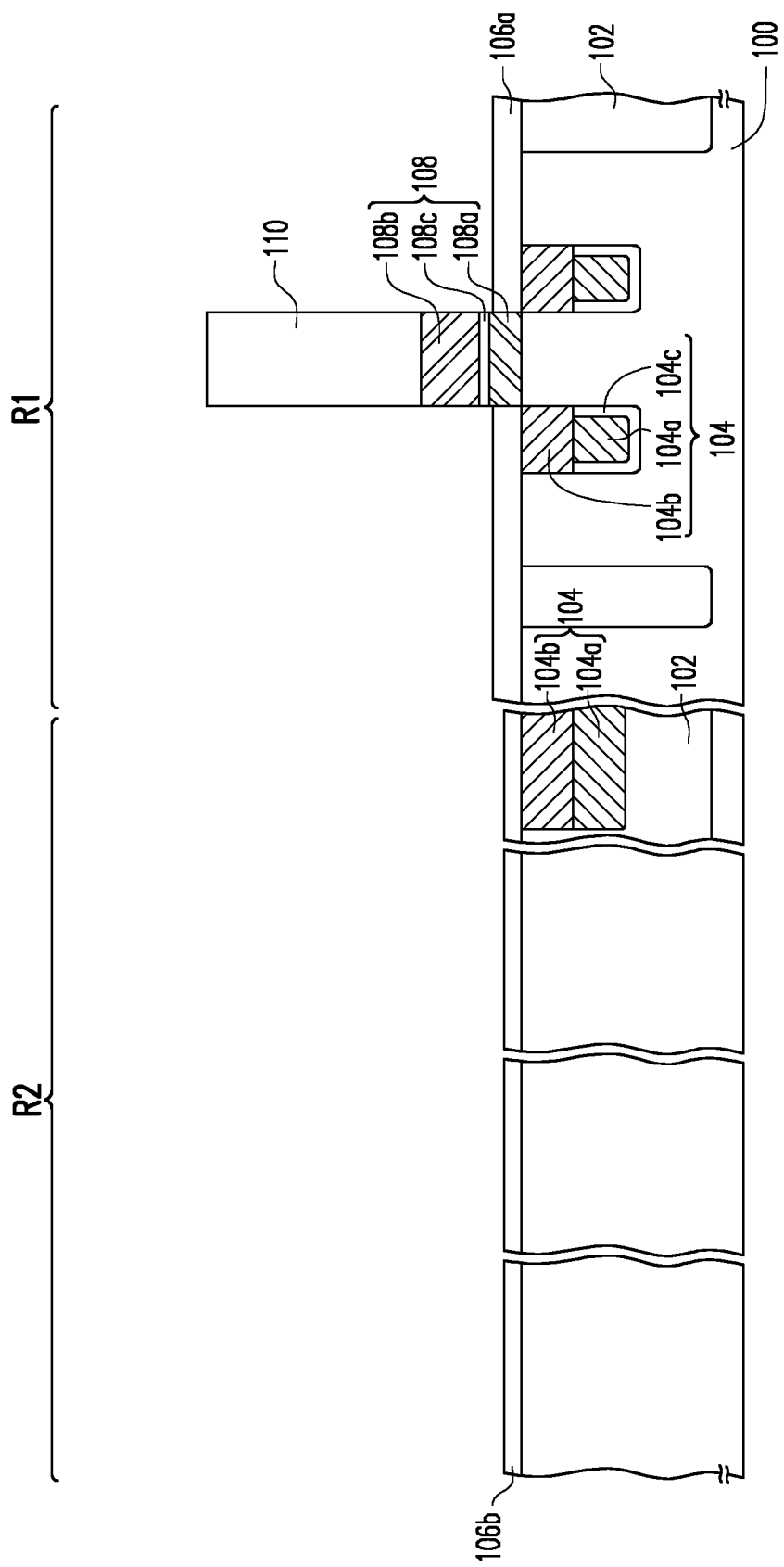
FIGS. 1A to 1H are cross-sectional diagrams illustrating a manufacturing process of a dynamic random access memory (DRAM) structure according to an embodiment of the invention.

Referring to FIG. 1A, a substrate 100 including a memory cell region R1 and a peripheral circuit region R2 are provided. Moreover, an isolation structure 102 may be formed in the substrate 100. The isolation structure 102 is a shallow trench isolation (STI) structure, for example.

A buried conductive line 104 is formed in the substrate 100. The buried conductive line 104 may be used as a word line of the DRAM. In the cross-sectional diagram of FIG. 1, the buried conductive line 104 in the memory cell region R1 may be disposed between the isolation structure 102. A method of forming the buried conductive line 104 includes, for example, combining a deposition process, a photolithographic process, and an etching process. The buried conductive line 104 includes a buried conductive layer 104a and may further include a cap layer 104b and a dielectric layer 104c. The buried conductive layer 104a is disposed in the substrate 100. A material of the buried conductive layer 104a is a metallic material, such as tungsten and so forth. The cap layer 104*b* is disposed on the buried conductive layer 104*a*. A material of the cap layer 104*b* is, for example, silicon nitride. The dielectric layer 104*c* is disposed between the buried conductive layer 104*a* and the substrate 100. A material of the dielectric layer 104*c* is, for example, silicon oxide.

A part of the buried conductive line 104 may be disposed in the peripheral circuit region R2. For example, the conductive layer 104*a* and the cap layer 104*b* of the buried conductive line 104 may be disposed in the isolation structure 102 in the peripheral circuit region R2.

A dielectric layer 106*a* may be formed on the substrate 100 in the memory cell region R1, and a material of the dielectric layer 106*a* is, for example, silicon oxide. A dielectric layer 106*b* may be formed on the substrate 100 in the peripheral circuit region R2, and a material of the dielectric layer 106*b* is, for example, silicon oxide. A method of forming the dielectric layer 106*a* and the dielectric layer 106*b*, for example, includes performing thermal oxidation or chemical vapor deposition. A thickness of the dielectric layer 106*a* is, for example, greater than a thickness of the dielectric layer 106*b*, but the invention is not limited thereto.

A conductive line structure 108 is formed on the substrate 100 in the memory cell region R1. The conductive line structure 108 may be used as a bit line of the DRAM. In the cross-sectional diagram of FIG. 1, the conductive line structure 108 may be disposed between the buried conductive lines 104, and part of the conductive line structure 108 may be disposed in the dielectric layer 106*a*. The conductive line structure 108 is formed, for example, by combining a deposition process and a patterning process. The conductive line structure 108 may be a multi-layer structure or a single-layer structure. In the embodiment, the conductive line structure 108 is exemplified by a multi-layer structure, but the invention not limited hereto. The conductive line structure 108 may include a conductive layer 108*a*, a conductive layer 108*b*, and a barrier layer 108*c*. The conductive layer 108*a* is disposed in the substrate 100 and may be located in the dielectric layer 106*a*. A material of the conductive layer 108*a* is, for example, a doped polysilicon. The conductive layer 108*b* is disposed on the conductive layer 108*a*. A material of the conductive layer 108*b* is a metallic material, such as tungsten and so forth. The barrier layer 108*c* is disposed between the conductive layer 108*a* and the conductive layer 108*b*. A material of the barrier layer 108*c* is, for example, Ti/TiN.

In addition, a cap layer 110 may be formed on the conductive line structure 108. A material of the cap layer 110 is, for example, silicon nitride. A method of forming the cap layer 110 is, for example, combining a deposition process and a patterning process.

Figure 1B:
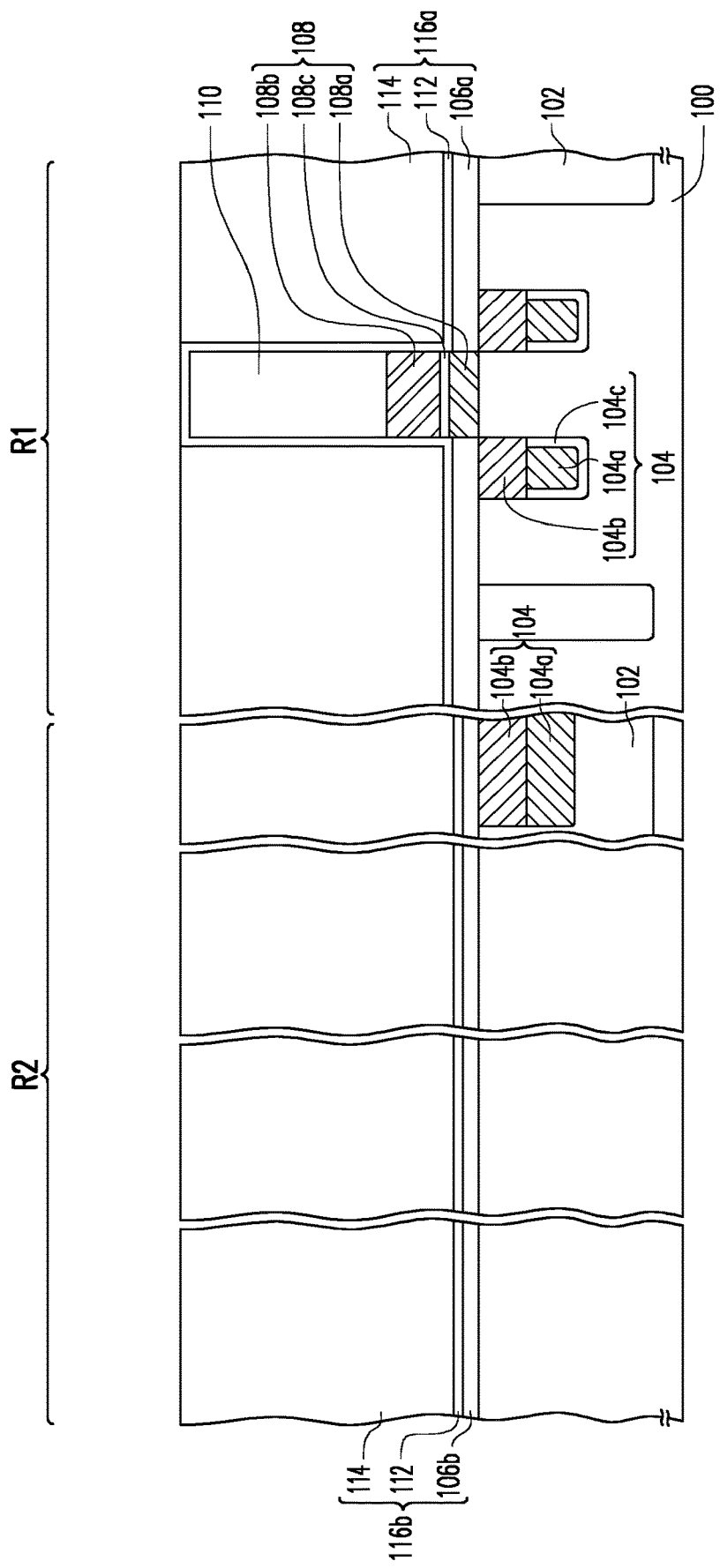

Referring to FIG. 1B, a blocking layer 112 may be conformally formed on the dielectric layer 106*a*, the dielectric layer 106*b*, and the cap layer 110. A material of the blocking layer 112 is, for example, silicon nitride. A method of forming the blocking layer 112 is, for example, a chemical vapor deposition method.

A dielectric layer 114 may be formed on the blocking layer 112. A dielectric layer structure 116*a* may be formed on the substrate 100 in the memory cell region R1, and a dielectric layer structure 116*b* may be formed on the substrate 100 in the peripheral circuit region R2. The dielectric layer structure 116*a* includes the dielectric layer 106*a*, the blocking layer 112, and the dielectric layer 114 disposed on the substrate 100 in sequence. The dielectric layer structure 116*b* includes the dielectric layer 106*b*, the blocking layer 112, and the dielectric layer 114 disposed on the substrate 100 in sequence. The dielectric layer 114 exposes the blocking layer 112 above the cap layer 110 in the memory cell region R1. A material of the dielectric layer 114 is, for example, silicon oxide. A method for forming the dielectric layer 114 is, for example, forming a dielectric material layer on the blocking layer 112 and then performing a planarization process (i.e., a chemical mechanical polishing process) on the dielectric material layer.

Figure 1C:
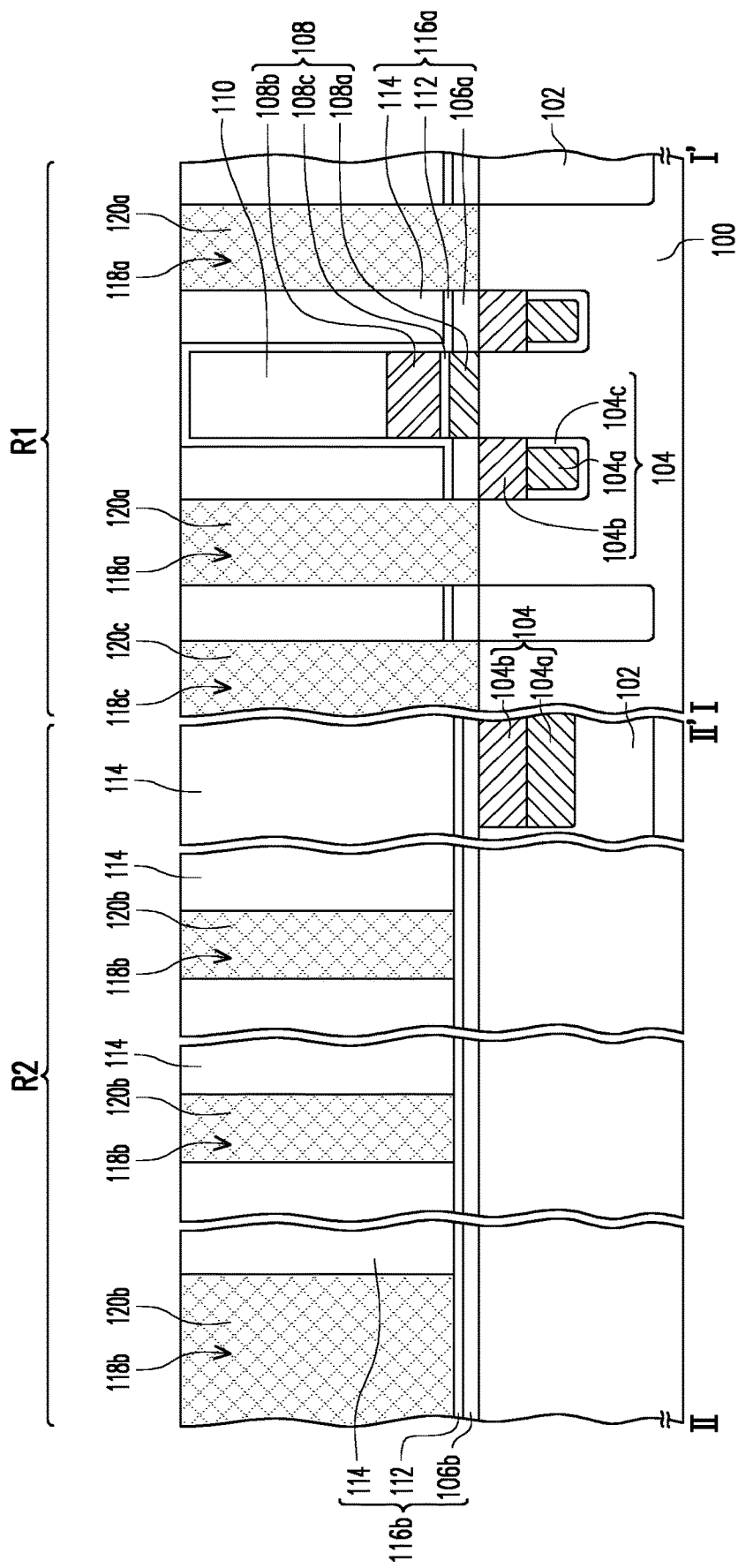
Figure 2:
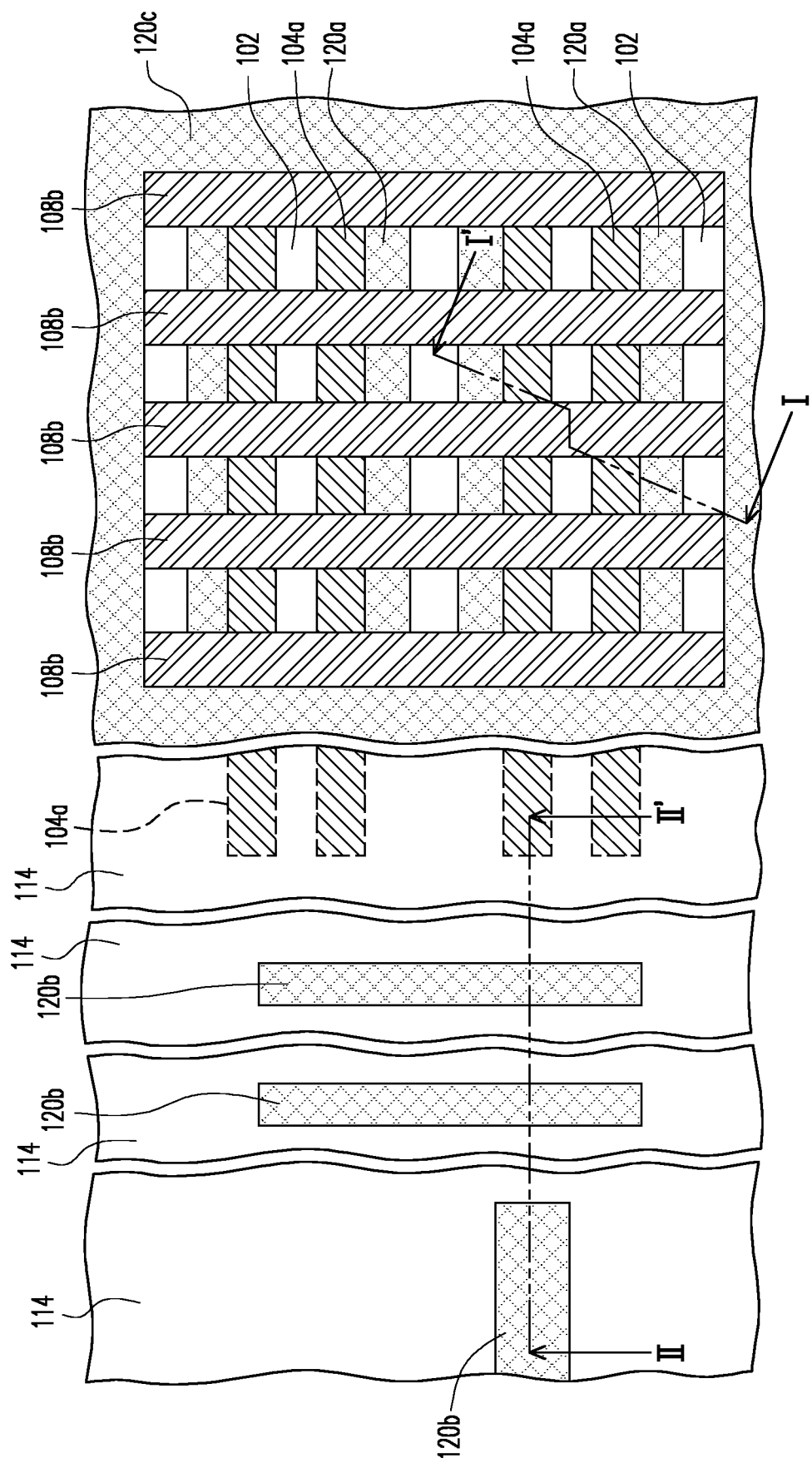
FIG. 2 is a top view of FIG. 1C.

FIG. 2 is a top view of FIG. 1C, wherein FIG. 1C is a cross-sectional diagram along a cross-sectional line I-I' (the memory cell region R1) and a cross-sectional line II-II' (the peripheral circuit region R2) of FIG. 2. In addition, in order to give a detailed description, illustrations of the dielectric layer structure 116*a* and the cap layer 110 in the memory cell region R1, and the cap layer 104*b* in the memory cell region R1 and the peripheral circuit region R2 are omitted in FIG. 2.

Referring to both FIG. 1C and FIG. 2, part of the dielectric layer structure 116*a* and part of the dielectric layer structure 116*b* are removed, an opening 118*a* exposing the substrate 100 is formed in the dielectric layer structure 116*a* in the memory cell region R1, and an opening 118*b* exposing the blocking layer 112 is formed in the dielectric layer structure 116*b* in the peripheral circuit region R2. In addition, part of the dielectric layer structure 116*a* may be further removed, and an opening 118*c* exposing the substrate 100 is formed in the dielectric layer structure 116*a* in the memory cell region R1, wherein the opening 118*c* surrounds a border of the memory cell region R1. A method of forming the opening 118*a*, the opening 118*b*, and the opening 118*c* is, for example, performing a patterning process on the dielectric layer structure 116*a* and the dielectric layer structure 116*b*.

A capacitor contact 120*a* and a dummy gate 120*b* are formed in the opening 118*a* and the opening 118*b*, respectively. The capacitor contact 120*a* and the conductive line structure 108 are disposed on one side and the other side of the buried conductive layer 104*a*, respectively. In addition, a guard ring structure 120*c* may be further formed in the opening 118*c*. The guard ring structure 120*c* surrounds the border of the memory cell region R1. A method of forming the capacitor contact 120*a*, the dummy gate 120*b*, and the guard ring structure 120*c* is, for example, forming a conductive layer that fills up the opening 118*a*, the opening 118*b*, and the opening 118*c* and then performing a planarization process (i.e., a chemical mechanical polishing process) on the conductive layer.

It can thus be seen that the capacitor contact 120*a* and the dummy gate 120*b* are formed by the same conductive layer. Thereby, a DRAM manufacturing process and a process of manufacturing the transistor structure with the metal gate structure can be integrated effectively, and complexity of the processes can also be reduced effectively. In addition, since the capacitor contact 120*a* and the guard ring structure 120*c* can be formed by the same conductive layer, complexity of the process can be reduced effectively.

Figure 1D:
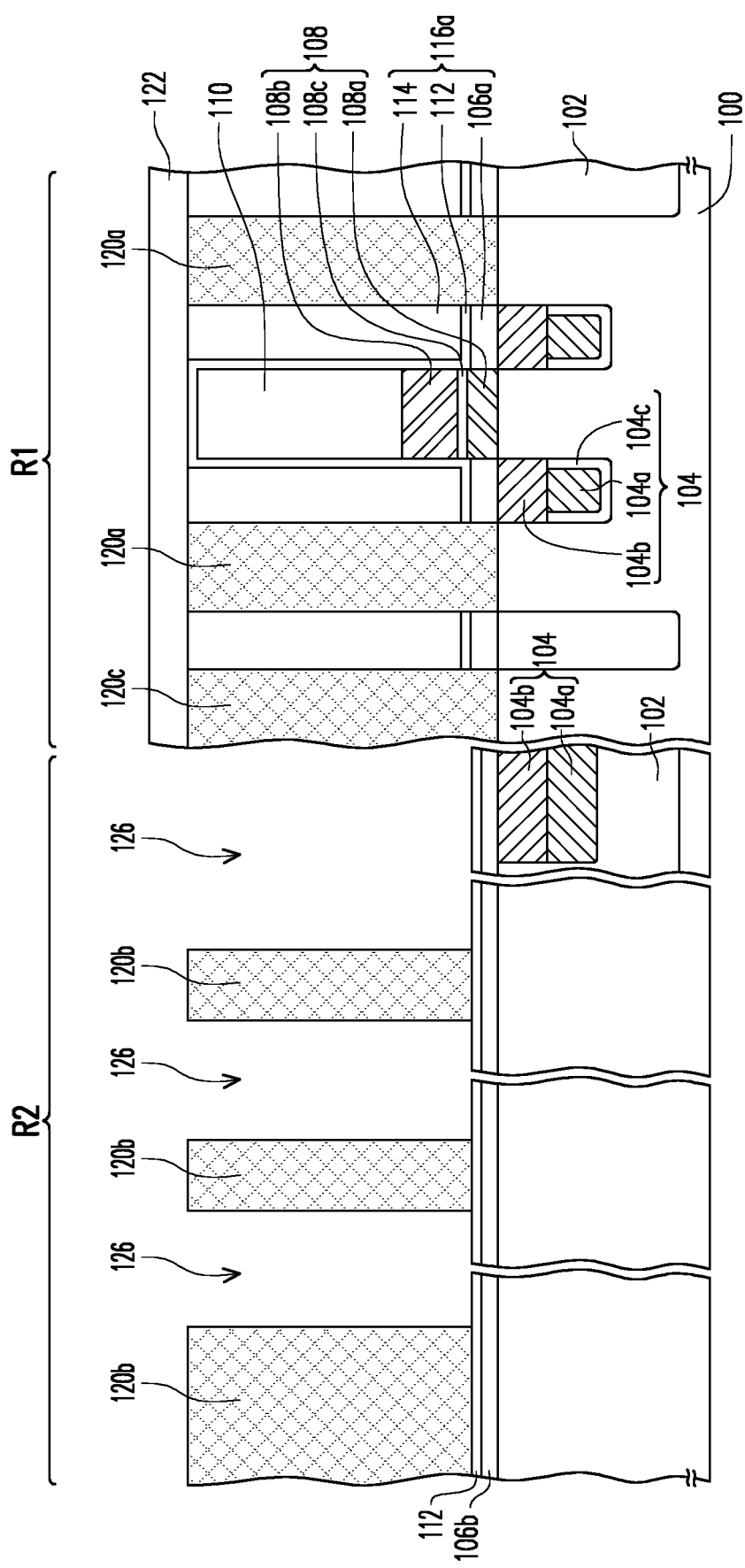

Referring to FIG. 1D, a stopper layer 122 that covers the capacitor contact 120*a*, the guard ring structure 120*c*, and the dielectric layer structure 116*a* is formed in the memory cell region R1. A material of the stopper layer 122 is, for example, different from the material of the dielectric layer 114. The material of the dielectric layer 114 is, for example, silicon oxide, and the material of the stopper layer 122 is, for example, silicon nitride. A method of forming the stopper layer 122 is, for example, forming a stopper material layer (not shown) comprehensively in the memory cell region R1 and the peripheral circuit region R2 and then performing a patterning process on the stopper material layer, so as to remove the stopper material layer in the peripheral circuit region R2.

The dielectric layer 114 in the peripheral circuit region R2 is removed, and an opening 126 is formed. The method for removing the dielectric layer 114 is, for example, a wet etching process. At the same time, the guard ring structure 120c and the stopper layer 122 can serve to protect the dielectric layer 114 in the memory cell region R1 so as to prevent the dielectric layer 114 in the memory cell region R1 from being damaged.

Figure 1E:
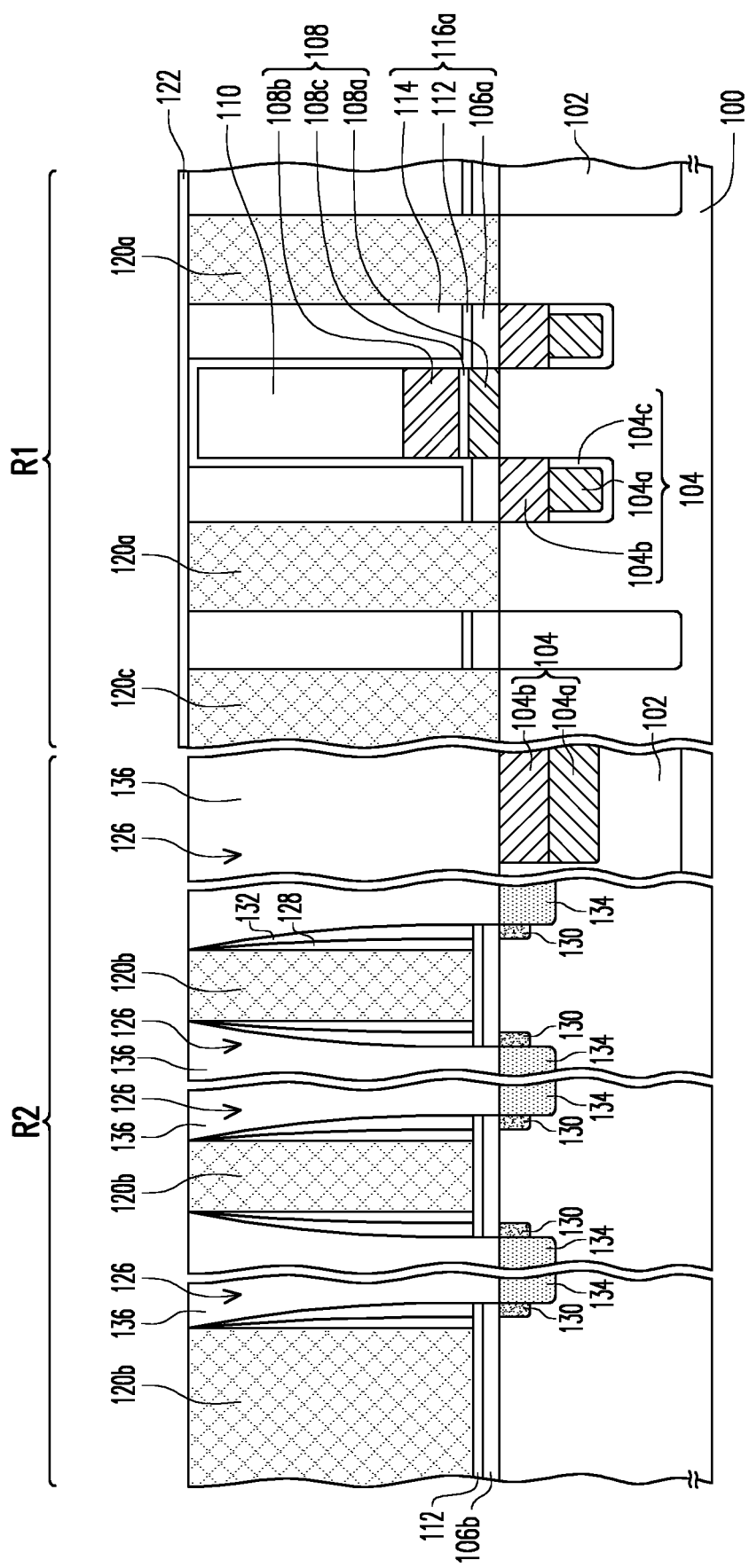

Referring to FIG. 1E, a spacer 128 can be formed on a sidewall of the dummy gate 120b. A material of the spacer 128 is, for example, silicon oxide. A method of forming the spacer 128 is, for example, forming a conformal spacer material layer (not shown) on the dummy gate 120 and then performing an etching back process on the spacer material layer.

A lightly doped region 130 may be formed in the substrate 100 at two sides of the dummy gate 120b. A method of forming the lightly doped region 130 is, for example, an ion implantation method.

A spacer 132 is formed on the spacer 128. A material of the spacer 132 is, for example, silicon oxide. A method of forming the spacer 132 is, for example, forming a conformal spacer material layer (not shown) on the dummy gate 120b and the spacer 128 and then performing an etching back process on the spacer material layer.

In addition, during the process of forming the spacer 128 and spacer 132, the blocking layer 112 and the dielectric layer 106b which are not covered by the dummy gate 120b, the spacer 128, and the spacer 132 may be removed.

A doped region 134 is formed in the substrate 100 at two sides of the dummy gate 120b, wherein the lightly doped region 130 is located between the dummy gate 120b and the doped region 134. A method of forming the doped region 134 is, for example, an ion implantation method.

A dielectric layer 136 is formed in the opening 126. A material of the dielectric layer 136 is, for example, silicon oxide. A method of forming the dielectric layer 136 is, for example, forming a dielectric material layer (not shown) filling up the opening 126 and then performing a planarization process (i.e., a chemical mechanical polishing process) on the dielectric material layer. In addition, during the planarization process performed on the dielectric material layer, a part of the stopper layer 122 may be removed, and the thickness of the stopper layer 122 is decreased as a result.

Figure 1F:
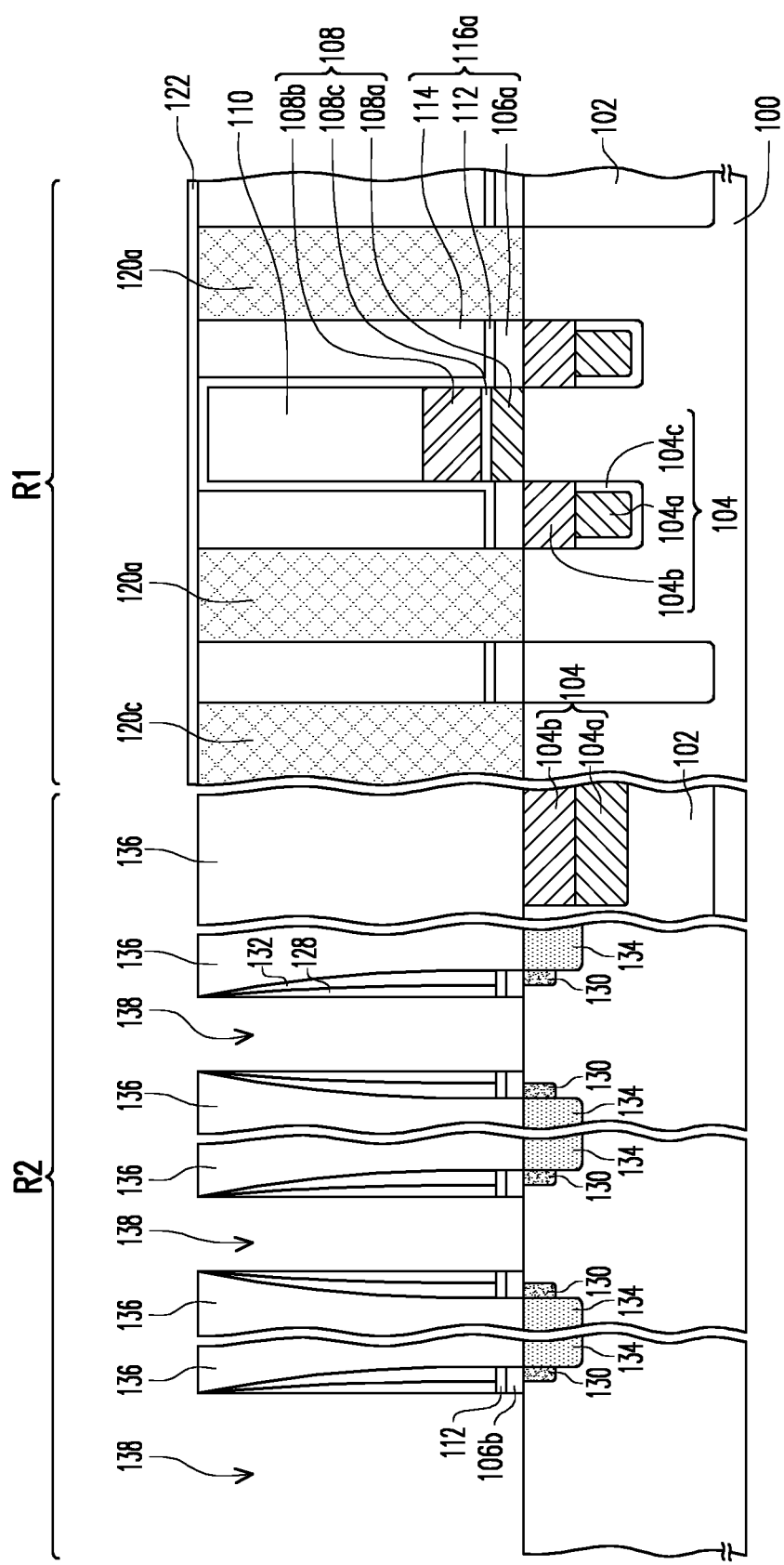

Referring to FIG. 1F, the dummy gate 120b in the dielectric layer 136 is removed, and an opening 138 is formed in the dielectric layer 136. The dummy gate 120b may be removed by using a self-aligning method. A method of removing the dummy gate 120b is, for example, a dry etching method.

The blocking layer 112 and the dielectric layer 106b exposed by the opening 138 are removed. A method of removing the blocking layer 112 and the dielectric layer 106b exposed by the opening 138 is, for example, a dry etching method.

Figure 1G:
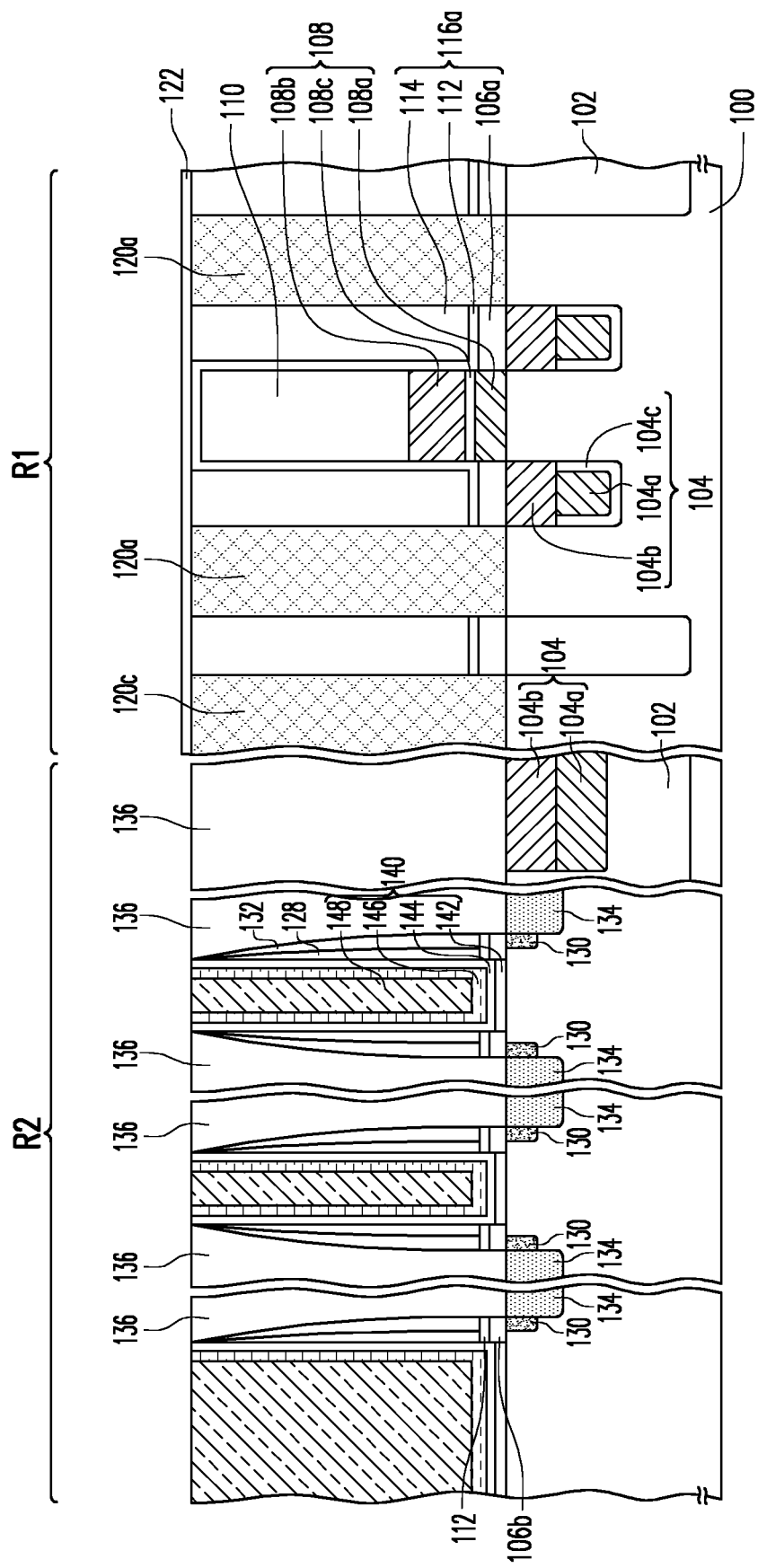

Referring to FIG. 1G, a metal gate structure 140 is formed in the opening 138. The metal gate structure 140 includes a gate dielectric layer 142, a high dielectric constant dielectric layer 144, a work function metal layer 146, and a metal gate 148 disposed on the substrate 100 in sequence. A material of the gate dielectric layer 142 is, for example, silicon oxide. A material of the high dielectric constant dielectric layer 144 is, for example, $HfO_x$. The work function metal layer 146 may be a P-type work function metal layer or an N-type work function metal layer, which is determined according to whether a P-type transistor device or an N-type transistor device is to be formed. A material of the P-type work function metal layer is, for example, TiN. A material of N-type work function metal layer is, for example, TiAlN or $La_2O_3$. A material of the metal gate 148 is, for example, tungsten, a composite layer of TiAl/TiN/W, or a composite layer of doped polysilicon/TiN/W.

A method of forming the metal gate structure 140 is, for example, forming a gate dielectric material layer, a high dielectric constant dielectric material layer, a work function metal material layer, and a metal gate material layer (not shown) in the opening 138 in sequence and then removing the gate dielectric material layer, the high dielectric constant dielectric material layer, the work function metal material layer, and the metal gate material layer outside the opening 138 through performing a planarization process (i.e., a chemical mechanical polishing process). A method of forming the gate dielectric material layer is, for example, a thermal oxidation method. A method of forming the high dielectric constant dielectric material layer is, for example, an atomic layer deposition (ALD) method. A method of forming the work function metal material layer is, for example, the ALD method. A method of forming the metal gate material layer is, for example, a physical vapor deposition method or a chemical vapor deposition method.

In view of the foregoing, the metal gate structure 140 is formed by performing a gate last process using the dummy gate 120b. In addition, although the metal gate structure 140 is formed by performing the gate last process according to the embodiment, the process of forming the metal gate structure 140 is not limited to the methods described in the embodiment.

Figure 1H:
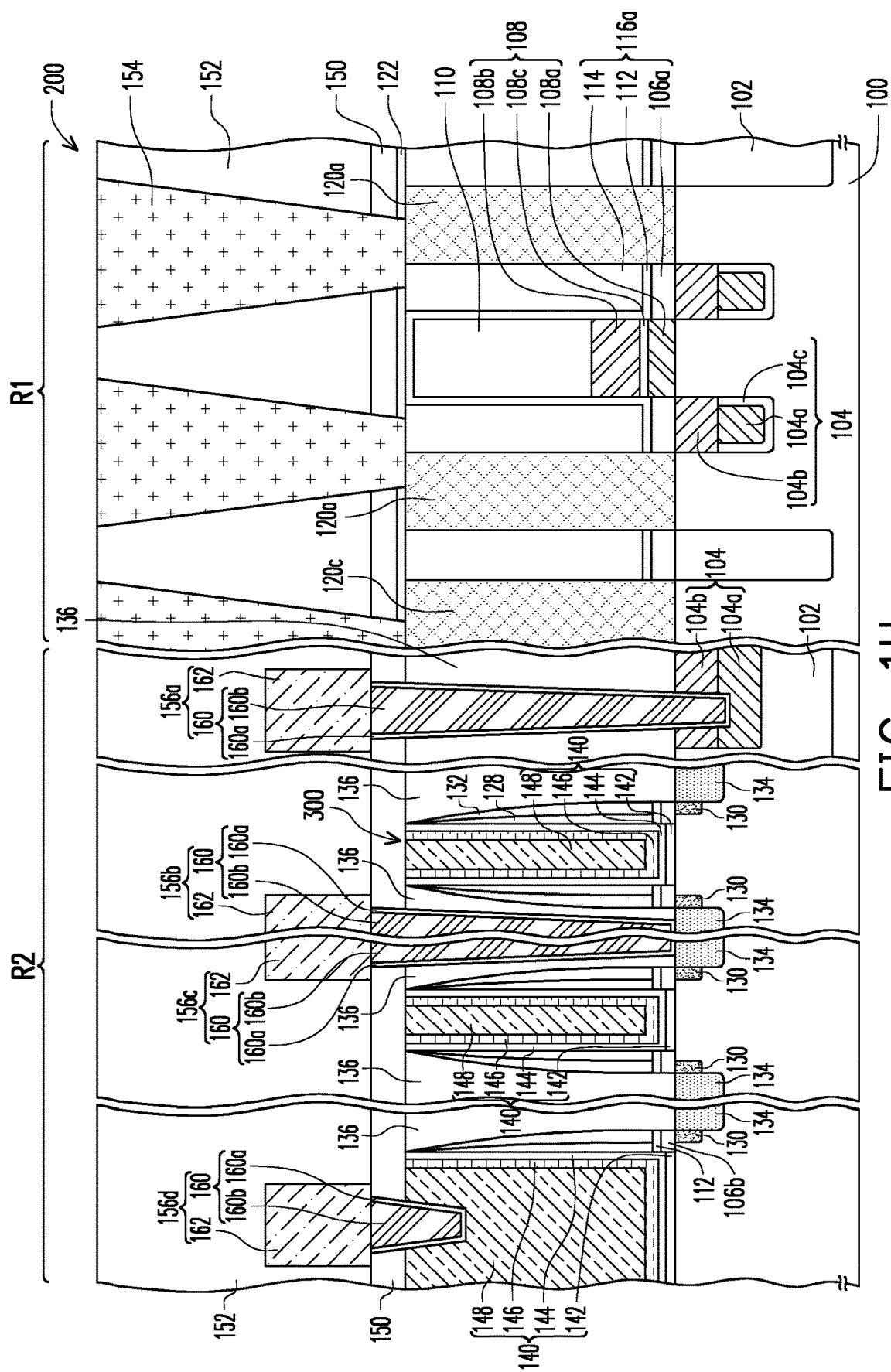

Referring to FIG. 1H, a dielectric layer 150 and a dielectric layer 152 are formed in the memory cell region R1 and the peripheral circuit region R2, a capacitor structure 154 is formed in the dielectric layer 150 and the dielectric layer 152 in the memory cell region R1, and interconnect structures 156a-156d in the dielectric layer 150 and the dielectric layer 152 are formed in the peripheral circuit region R2. The capacitor structure 154 is coupled to the capacitor contact 120a. In addition, the capacitor structure 154 may be further coupled to the guard ring structure 120c. A material of the dielectric layer 150 is, for example, silicon nitride. A material of the dielectric layer 152 is, for example, silicon oxide. In FIG. 1H, the capacitor structure 154 is presented as a schematic illustration only, and the invention is not limited thereto. People having ordinarily skill in the art may design and adjust the capacitor structure 154 based on actual needs.

The interconnect structure 156a passes through the dielectric layer 136 and the cap layer 104b and connects to the buried conductive layer 104a. The interconnect structure 156b and the interconnect structure 156c pass through the dielectric layer 136 and connect to a corresponding doped region 134, respectively. The interconnect structure 156d connects to the metal gate structure 140 on the far left side of FIG. 1H. The interconnect structures 156a-156d include a contact 160 and a conductive line 162 connecting to each other. The contact 160 includes a barrier layer 160a and a conductive layer 160b, wherein the conductive layer 160b is disposed on the barrier layer 160a. In the cross-sectional view of FIG. 1H, only the interconnect structures 156a-156d are illustrated; however, people having ordinary skill in the art understand that other interconnect structures may be further included in the embodiment.

A dynamic random access memory (DRAM) 200 may be formed in the memory cell region R1, and a transistor structure 300 with a metal gate structure 140 may be formed in the peripheral circuit region R2 according to the method provided in the embodiment. The DRAM 200 includes the capacitor contact 120a coupled to the capacitor structure 154. The metal gate structure 140 is formed by a manufacturing process using a dummy gate 120b. In addition, although the DRAM 200 and the transistor structure 300 are formed by using the method provided in the embodiments, the invention is not limited hereto.

According to the previous embodiments, it can be seen that the capacitor contact 120a and the dummy gate 120b are formed by the same conductive layer. Hence, the DRAM manufacturing process and the process of manufacturing the transistor structure 300 with the metal gate structure 140 can be integrated effectively, and complexity of the process can be thus effectively reduced.

A DRAM structure provided in the embodiment structure is described below with reference to FIG. 1H.

Referring to FIG. 1H and FIG. 2, a DRAM structure includes a substrate 100, a DRAM 200, and a guard ring structure 120c. The substrate 100 includes a memory cell region R1. The DRAM 200 is disposed in the memory cell region R1, wherein the DRAM 200 includes a capacitor contact 120a coupled to a capacitor structure 154. The guard ring structure 120c surrounds a border of the memory cell region R1, so as to effectively prevent components in the memory cell region R1 (i.e., a dielectric layer 114) from being damaged during the process of forming a transistor structure 300 in the peripheral circuit region R2. The capacitor contact 120a and the guard ring structure 120c originate from the same conductive layer, and complexity of the process can be reduced effectively as a result.

In the embodiment, the DRAM 200 may include a buried conductive line 104, a dielectric layer structure 116a, a conductive line structure 108, the capacitor contact 120a, the capacitor structure 154, and a stopper layer 122. The buried conductive line 104 is disposed in the substrate 100. The buried conductive line 104 may include a buried conductive layer 104a and may further include a cap layer 104b and a dielectric layer 104c. The buried conductive layer 104a is disposed in the substrate 100. The cap layer 104b is disposed on the buried conductive layer 104a. The dielectric layer 104c is disposed between the buried conductive layer 104a and the substrate 100. The dielectric layer structure 116a is disposed on the substrate 100. The dielectric layer structure 116a includes the dielectric layer 106a, the blocking layer 112, and the dielectric layer 114 disposed on the substrate 100 in sequence. The conductive line structure 108 is disposed on the substrate 100 and located in the dielectric layer structure 116a. The conductive line structure 108 may include a conductive layer 108a, a conductive layer 108b, and a barrier layer 108c. The conductive layer 108a is disposed on the substrate 100 and may be located in the dielectric layer 106a. The conductive layer 108b is disposed on the conductive layer 108a. The barrier layer 108c is disposed between the conductive layer 108a and the conductive layer 108b. The capacitor contact 120a is disposed in the dielectric layer structure 116a and connected to the substrate 100. The capacitor structure 154 is disposed on the capacitor contact 120a. The stopper layer 122 is disposed on the guard ring structure 120c and covers the memory cell region R1. The guard ring structure 120c and the stopper layer 122 can be used to protect the dielectric layer 114 in the memory cell region R1, so as to prevent the dielectric layer 114 from being damaged during the process of forming the transistor structure 300 in the peripheral circuit region R2.

In addition, the substrate 100 further includes the peripheral circuit region R2. The DRAM structure further includes the transistor structure 300 in the peripheral circuit region R2. The transistor structure 300 may be a P-type transistor structure or a N-type transistor structure. The transistor structure 300 is exemplified by the P-type transistor structure when described in the embodiment.

The transistor structure 300 includes a metal gate structure 140 and two doped regions 134. The metal gate structure 140 is disposed on the substrate 100. The metal gate structure 140 includes a gate dielectric layer 142, a high dielectric constant dielectric layer 144, a work function metal layer 146, and a metal gate 148 disposed on the substrate 100 in sequence. The doped regions 134 are disposed in the substrate 100 at the two sides of the metal gate structure 140. Moreover, the transistor structure 300 can further include at least one of a spacer 128, a lightly doped region 130, and a spacer 132. The spacer 128 and the spacer 132 are disposed on the sidewall of the metal gate structure 140, respectively. The lightly doped region 130 is disposed in the substrate 100 and between the metal gate structure 140 and the doped region 134.

In addition, in the DRAM structure, each component, the arrangement manner, the forming method, and efficiency of the DRAM 200 and the transistor structure 300 are described in detail in the previous embodiments, and thus no other explanation is provided hereinafter.

According to the previous embodiments, the DRAM structure has the guard ring structure 120c surrounding the memory cell region R1, and thus the components in the memory cell region R1 may be prevented from being damaged during the process of forming the transistor structure 140 in the peripheral circuit region R2. In addition, since the capacitor contact 120a and the guard ring structure 120c originate from the same conductive layer, the process complexity can be reduced effectively.

Figure 3:
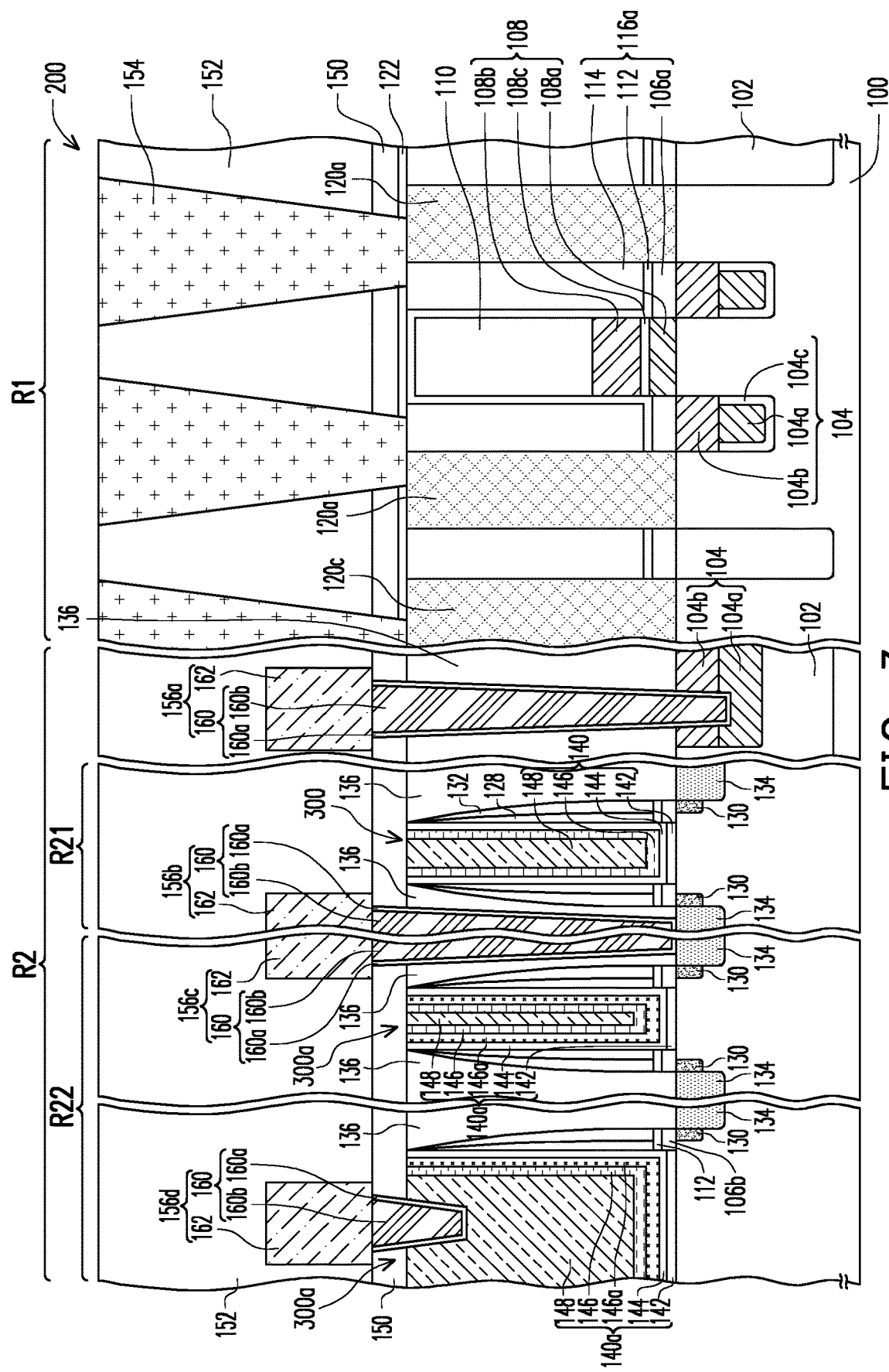
FIG. 3 is a cross-sectional diagram illustrating a DRAM structure according to another embodiment of the invention.

FIG. 3 is a cross-sectional diagram illustrating a DRAM structure according to another embodiment of the invention.

Referring to both FIG. 1H and FIG. 3, the differences in the DRAM structures depicted in FIG. 3 and FIG. 1H are as follows. In the DRAM structure of FIG. 3, the peripheral circuit region R2 in the substrate 100 can include a first conductive type transistor region R21 and a second conductive type transistor region R22. The first conductive type transistor region R21 and the second conductive type transistor region R22 are one and the other one of the P-type transistor region and the N-type transistor region, respectively. In addition, the DRAM structure includes the transistor structure 300 and a transistor structure 300a of different conductive types. The transistor structure 300 and the transistor structure 300a are disposed in the first conductive type transistor region R21 and the second conductive type transistor region R22, respectively. A difference between the transistor structure 300 and the transistor structure 300a is that the transistor structure 300a further includes a work function metal layer 146a. The work function metal layer 146a is disposed between a high dielectric constant dielectric layer 144 and a work function metal layer 146. In addition, in FIG. 3, identical reference numerals are used for the same components as those in FIG. 1H, and description of those elements is omitted.

In this embodiment, the first conductivity type transistor region R21 and the second conductive type transistor region R22 are exemplified by the P-type transistor region and the N-type transistor region, respectively; however, the invention is not limited thereto. Under such circumstances, the transistor structure 300 and the transistor structure 300a are the P-type transistor structure and the N-type transistor structure, respectively, and the work function metal layer 146 and the work function metal layer 146a are the P-type work function metal layer and the N-type work function metal layer, respectively.

Overall, the manufacturing method of the DRAM structure provided by the embodiments can effectively integrate the DRAM manufacturing process and the process of manufacturing the transistor structure with the metal gate structure and thus can reduce process complexity effectively. In addition, the DRAM structure provided in the previous embodiments effectively can prevent components in the memory cell region from being damaged during the process of forming the transistor structure in the peripheral circuit region and thus can reduce process complexity effectively.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A dynamic random access memory (DRAM) structure, comprising:
   a substrate comprising a memory cell region;
   a DRAM disposed in the memory cell region, wherein the DRAM comprises a capacitor contact coupled to a capacitor structure; and
   a guard ring structure surrounding a border of the memory cell region, wherein the capacitor contact and the guard ring structure originate from the same conductive layer.

2. The DRAM structure as claimed in claim 1, further comprising a stopper layer, wherein the stopper layer is disposed on the guard ring structure and covers the memory cell region.

3. The DRAM structure as claimed in claim 1, wherein the DRAM comprises:
   a buried conductive line disposed in the substrate;
   a dielectric layer structure disposed on the substrate;
   a conductive line structure disposed on the substrate and located in the dielectric layer structure;
   wherein the capacitor contact disposed in the dielectric layer structure and connected to the substrate; and
   wherein the capacitor structure disposed on the capacitor contact.

4. The DRAM structure as claimed in claim 3, wherein the buried conductive line comprises:
   a buried conductive layer disposed in the substrate;
   a cap layer disposed on the buried conductive layer; and
   a dielectric layer disposed between the buried conductive layer and the substrate.

5. The DRAM structure as claimed in claim 1, wherein the substrate further comprises a peripheral circuit region, and
   wherein the DRAM structure further comprises a transistor structure disposed in the peripheral circuit region.

6. The DRAM structure as claimed in claim 5, wherein the transistor structure comprises:
   a metal gate structure disposed on the substrate; and
   two doped regions disposed in the substrate at two sides of the metal gate structure.

7. The DRAM structure as claimed in claim 6, wherein the metal gate structure comprises a gate dielectric layer, a high dielectric constant dielectric layer, a work function metal layer and a metal gate stacked and disposed on the substrate in sequence.

8. The DRAM structure as claim in claim 7, wherein the peripheral circuit region comprises a first conductive type transistor region and a second conductive type transistor region,
   wherein the work function metal layer comprises a first conductive type work function metal layer in the first conductive type transistor region, and
   wherein the work function metal layer comprises a second conductive type work function metal layer in the second conductive type transistor region.

9. The DRAM structure as claimed in claim 6, wherein the transistor structure further comprises a spacer, and
   wherein the spacer is disposed on a sidewall of the metal gate structure.

\* \* \* \* \*